(12) United States Patent
Bielefeld et al.

(10) Patent No.: US 7,772,702 B2
(45) Date of Patent: *Aug. 10, 2010

(54) DIELECTRIC SPACERS FOR METAL INTERCONNECTS AND METHOD TO FORM THE SAME

(75) Inventors: Jeffery D. Bielefeld, Forest Grove, OR (US); Boyan Boyanov, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 758 days.

This patent is subject to a terminal disclaimer.

(21) Appl. No.: 11/525,709

(22) Filed: Sep. 21, 2006

(65) Prior Publication Data

US 2008/0073748 A1 Mar. 27, 2008

(51) Int. Cl.
*H01L 23/48* (2006.01)
*H01L 23/52* (2006.01)
*H01L 23/40* (2006.01)

(52) U.S. Cl. .................. 257/758; 522/774
(58) Field of Classification Search .......... 257/758, 257/750, 774, 522
See application file for complete search history.

(56) References Cited

U.S. PATENT DOCUMENTS

| | | | |
|---|---|---|---|
| 5,759,913 A * | 6/1998 | Fulford et al. ............... 438/624 |
| 5,876,798 A | 3/1999 | Vassiliev |
| 5,982,035 A * | 11/1999 | Tran et al. ................... 257/750 |
| 6,064,118 A | 5/2000 | Sasaki |
| 6,191,027 B1 | 2/2001 | Omura |
| 6,252,290 B1 | 6/2001 | Quek et al. |
| 6,255,224 B1 * | 7/2001 | Kim ........................... 438/723 |
| 6,265,321 B1 | 7/2001 | Chooi et al. |
| 6,303,464 B1 * | 10/2001 | Gaw et al. ................... 438/422 |
| 6,368,939 B1 | 4/2002 | Sasaki |
| 6,423,630 B1 * | 7/2002 | Catabay et al. ............. 438/624 |
| 6,440,839 B1 | 8/2002 | Partovi et al. |
| 6,472,266 B1 * | 10/2002 | Yu et al. ..................... 438/241 |
| 6,489,195 B1 * | 12/2002 | Hwang et al. .............. 438/238 |
| 6,495,445 B2 | 12/2002 | Clevenger |
| 6,577,011 B1 | 6/2003 | Buchwalter et al. |
| 6,737,725 B2 | 5/2004 | Grill et al. |
| 6,897,508 B2 * | 5/2005 | Sneh .......................... 257/301 |

(Continued)

FOREIGN PATENT DOCUMENTS

JP 14050686 2/2002

(Continued)

OTHER PUBLICATIONS

International Search Report and Written Opinion from PCTUS2007/010484 mailed Nov. 8, 2007, 10 pgs.

(Continued)

*Primary Examiner*—Sue Purvis
*Assistant Examiner*—Teresa M Arroyo
(74) *Attorney, Agent, or Firm*—Blakely, Sokoloff, Taylor & Zafman LLP

(57) ABSTRACT

Dielectric spacers for a plurality of metal interconnects and a method to form such dielectric spacers are described. In one embodiment, the dielectric spacers are adjacent to neighboring metal interconnects having flared profiles and are discontiguous from one another. In another embodiment, the dielectric spacers provide a region upon which un-landed vias may effectively land.

23 Claims, 12 Drawing Sheets

U.S. PATENT DOCUMENTS

| | | | |
|---|---|---|---|
| 6,995,073 | B2 | 2/2006 | Liou |
| 7,030,005 | B2 | 4/2006 | Lee |
| 7,042,095 | B2 * | 5/2006 | Noguchi et al. ............. 257/762 |
| 7,393,776 | B2 * | 7/2008 | Colburn et al. ............. 438/619 |
| 7,473,632 | B2 * | 1/2009 | Ueda ........................ 438/622 |
| 7,579,233 | B2 * | 8/2009 | Hwang ...................... 438/239 |
| 2001/0051423 | A1 * | 12/2001 | Kim et al. .................. 438/624 |
| 2002/0127844 | A1 | 9/2002 | Grill et al. |
| 2002/0140101 | A1 * | 10/2002 | Yang et al. ................. 257/762 |
| 2003/0183940 | A1 * | 10/2003 | Noguchi et al. ............ 257/767 |
| 2004/0084774 | A1 | 5/2004 | Li et al. |
| 2004/0121577 | A1 | 6/2004 | Yu et al. |
| 2004/0266167 | A1 | 12/2004 | Dubin et al. |
| 2005/0062165 | A1 | 3/2005 | Saenger et al. |
| 2005/0079700 | A1 | 4/2005 | Schindler et al. |
| 2005/0184397 | A1 | 8/2005 | Gates et al. |
| 2005/0285269 | A1 * | 12/2005 | Cao et al. .................. 257/758 |
| 2006/0063373 | A1 | 3/2006 | Gambino et al. |
| 2006/0170110 | A1 | 8/2006 | Akram et al. |
| 2006/0197230 | A1 | 9/2006 | Anezaki et al. |
| 2007/0257368 | A1 * | 11/2007 | Hussein et al. ............. 257/758 |
| 2008/0108219 | A1 * | 5/2008 | Huebinger et al. ......... 438/618 |

FOREIGN PATENT DOCUMENTS

| | | |
|---|---|---|
| KR | 1020010003760 | 1/2001 |
| KR | 1020050057784 | 6/2005 |

OTHER PUBLICATIONS

International Search Report and Written Opinion from PCT/US2007/020443 mailed Jan. 25, 2008, 9 pgs.

International Preliminary Report on Patentability from PCT/US2007/010484 mailed Nov. 13, 2008, 7 pgs.

U.S. Appl. No. 11/429,165, filed May 4, 2006, Hussein et al.

Noguchi, Junji, et al., "Process and Reliability of Air-Gap Cu Interconnect Using 90-nm Node Technology," IEEE Transactions on Electron Devices, vol. 52, No. 3, Mar. 2005, pp. 352-359.

Chan, Kevin, et al., "Air-Gap Fabrication Using a Sacrificial Polymeric Thin Film Synthesized via Initiated Chemical Vapor Deposition," Journal of The Electrochemical Society, 153(4) C223-C228 (2006).

International Preliminary Report on Patentability from PCT/US2007/020443 mailed Apr. 2, 2009, 5 pgs.

Final Office Action from U.S. Appl. No. 11/429,165 mailed May 27, 2009, 13 pgs.

Non-Final Office Action for U.S. Appl. No. 11/429,165, mailed Oct. 8, 2008, 17 pgs.

Office Action from Chinese Application No. 200780031072.0 mailed Dec. 11, 2009, 4 pgs.

Official GPTO Communication for German Patent Application Nu. 112007002215.9-43 mailed May 28, 2009, 2 pgs.

* cited by examiner

DIELECTRIC SPACERS FOR METAL INTERCONNECTS AND METHOD TO FORM THE SAME

BACKGROUND OF THE INVENTION

1) Field of the Invention

The invention is in the field of Integrated Circuits.

2) Description of Related Art

Metal interconnects are utilized in the fabrication of integrated circuits as a means of connecting various electronic and/or semiconductor devices into a global circuitry. Two key factors considered when fabricating such metal interconnects are the resistance (R) of each metal interconnect and the coupling capacitance (C), i.e. cross-talk, generated between the metal interconnects. Both of these factors hamper the efficiency of metal interconnects. Thus, it has been desirable to reduce both the resistance and the capacitance in metal interconnects in order to mitigate the so called "RC-delay."

For the past decade, the performance of integrated circuits, such as those found on microprocessors, has been greatly enhanced by the incorporation of copper interconnects into the "back-end" of line processing sequence. The presence of such copper interconnects, versus aluminum interconnects, greatly reduces the resistance of such interconnects, lending to their improved conduction and efficiency.

Attempts to reduce the coupling capacitance generated between metal interconnects have included the use of low-K (2.5-4) dielectric layers that house the metal interconnects, where K is the dielectric constant of the dielectric layers. However, the incorporation of such films has proven to be challenging. Other attempts to reduce the coupling capacitance between metal interconnects has focused on "air-gap" technologies, where no dielectric layer exists between the metal lines. Although this technique has been effective for reducing the coupling capacitance, a result of air having a K-value of only 1, the structural integrity of a plurality of metal interconnects may be compromised in the absence of supporting dielectric layers.

Thus, a method to migrate the RC-delay in a plurality of metal interconnects is described herein.

DETAILED DESCRIPTION

A plurality of metal interconnects with dielectric spacers for use in an integrated circuit and a process to fabricate such a plurality of metal interconnects are described. In the following description, numerous specific details are set forth, such as specific dimensions and chemical regimes, in order to provide a thorough understanding of the present invention. It will be apparent to one skilled in the art that the present invention may be practiced without these specific details. In other instances, well-known processing steps, such as patterning steps, are not described in detail, in order to not unnecessarily obscure the present invention. Furthermore, it is understood that the various embodiments shown in the figures are illustrative representations and are not necessarily drawn to scale.

Disclosed herein are dielectric spacers for metal interconnects and a method to form such dielectric spacers. Incorporating dielectric spacers adjacent to the sidewalls of metal interconnects may provide physical support for a plurality of interconnects and their connecting vias, may provide a region onto which un-landed vias may reside, and may lead to a relatively low coupling capacitance between various metal interconnects. For example, an air-gap metal interconnect architecture that provides sufficient structural integrity for incorporation into an integrated circuit and that provides a region onto which un-landed vias may "land" may be formed.

The formation of metal interconnects with a reduced coupling capacitance, i.e. a reduced cross-talk, among each metal interconnect may be enabled by incorporating dielectric spacers into an interconnect structure. Thus, dielectric spacers can be used to mitigate an RC-delay within a series of metal interconnects. For example, in accordance with an embodiment of the present invention, dielectric spacers are incorporated between metal interconnects to facilitate the use of reduced dielectric constant materials (e.g. materials with a dielectric constant less than that of silicon dioxide) in the gaps between such metal interconnects. Embodiments of such reduced dielectric constant materials include low-K dielectric layers (layers with a dielectric constant of 2-4, where silicon dioxide is around 4) or even air, which has a dielectric constant of 1. Thus, including dielectric spacers between a plurality of metal interconnects may limit incorporation of dielectric layers to only the levels where vias reside. Such an approach may be carried out without compromising the integrity of an electronic structure based on a plurality of metal interconnects.

Figure 1:
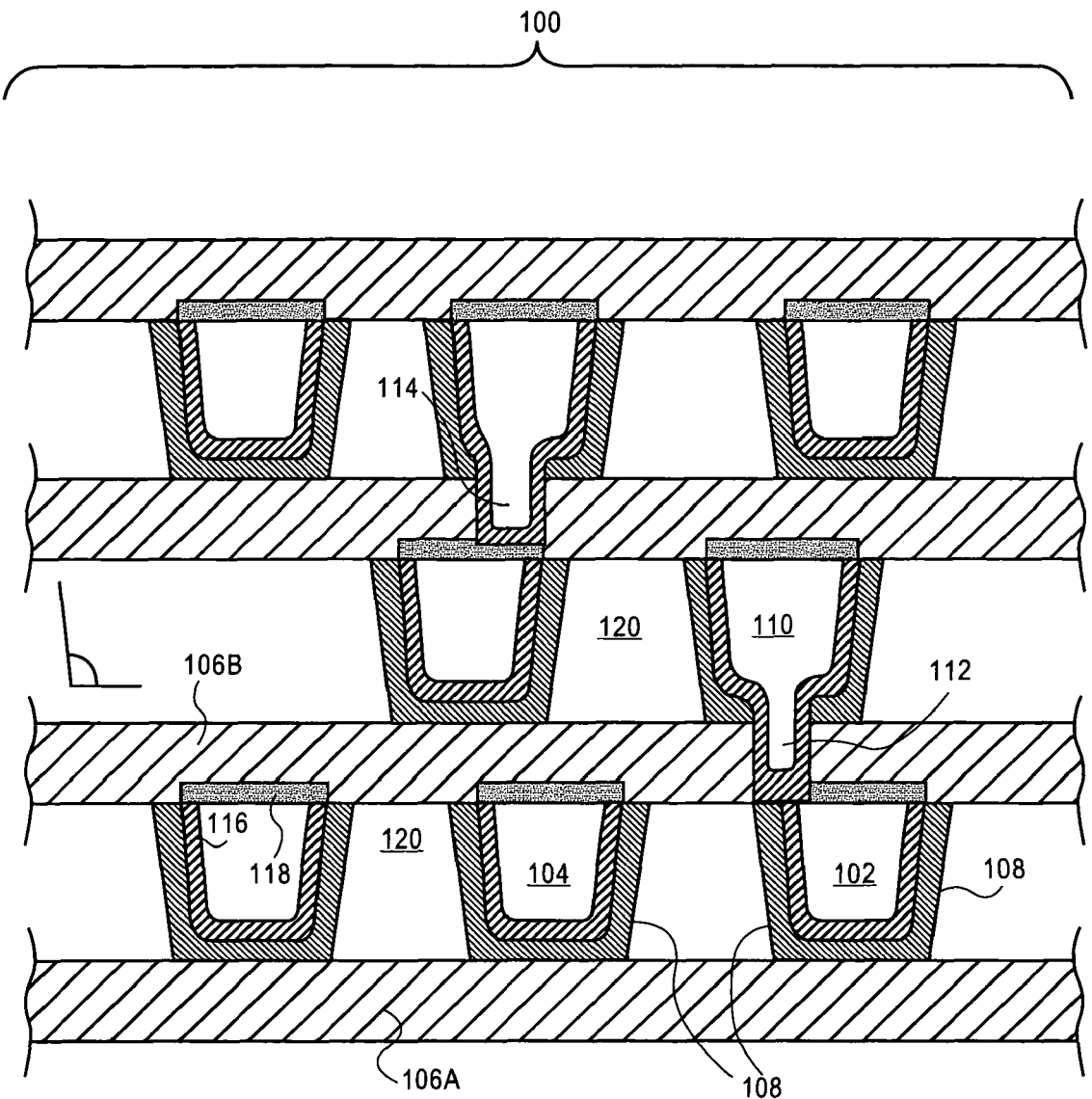
FIG. 1 illustrates a cross-sectional view of a plurality of interconnects having flared profiles with discontiguous spacers, in accordance with an embodiment of the present invention.

Hence, it may be desirable to incorporate dielectric spacers adjacent to the sidewalls of a plurality of metal interconnects. In accordance with an embodiment of the present invention, an interconnect structure 100 comprising a plurality of metal interconnects is shown in FIG. 1. Metal interconnects 102 and 104 are spaced apart from one another and sit between dielectric layers 106A and 106B. Dielectric spacers 108 reside adjacent to the sidewalls of, and underneath, metal interconnects 102 and 104.

Metal interconnects 102 and 104 may be comprised of any material suitable to conduct a current flow, such as copper, silver, aluminum or an alloy thereof. In one embodiment, metal interconnects 102 and 104 are comprised of polycrystalline copper with an atomic composition in the range of 97-100% copper atoms. In another embodiment, metal interconnects 102 and 104 are comprised of an array of interspersed carbon nanotubes. Metal interconnects 102 and 104 may exhibit any cross-sectional shape that does not significantly degrade their performance, such as a square, a rectangle, a circle, an ellipse, a U, a V, a T or an A-frame cross-sectional shape. In accordance with an embodiment of the present invention, the cross-sectional shapes of metal interconnects 102 and 104 are artifacts of the processing scheme utilized to form metal interconnects 102 and 104. A flared profile is an example of such an artifact and may be characterized by a wider top surface than bottom surface and a sidewall that tapers inward from the top surface to the bottom surface. In one embodiment, metal interconnects 102 and 104 have flared profiles with a flared angle θ in between 90 degrees and 155 degrees, as depicted in FIG. 1. In a specific embodiment, the flared angle is in the range of 105-135 degrees.

Dielectric layers 106A and 106B may comprise any material suitable to provide structural integrity to the interconnect structure 100. In one embodiment, the dielectric constant of dielectric layers 106A and 106B is in the range of 2-5.5. In another embodiment, the dielectric constant of dielectric layers 106A and 106B is in the range of 2.5-4. In one embodiment, dielectric layers 106A and 106B are comprised of a material selected form the group consisting of silicon dioxide, a silicate, a carbon-doped oxide with 0-10% porosity or fluorinated versions thereof.

Referring to FIG. 1, dielectric spacers 108 reside adjacent to the sidewalls of, and underneath, metal interconnects 102 and 104. Dielectric spacers 108 may be comprised of any material suitable to provide structural integrity, yet minimal capacitance, to the interconnect structure 100. In one embodiment, the dielectric constant of dielectric spacers 108 is in the range of 3-7. In another embodiment, the dielectric constant of dielectric spacers is in between 4-6 and is greater than the dielectric constant of dielectric layer 106. In one embodiment, dielectric spacers 108 are comprised of a material selected from the group consisting of silicon nitride, silicon carbide, nitrogen-doped silicon carbide, oxygen-doped silicon carbide, boron-doped carbon nitride or boron-doped silicon carbide. In an alternative embodiment, dielectric spacers 108 comprise a metal-based material selected from the group consisting of CoW or CoWBP. Dielectric spacers 108 may be conformal to metal interconnects with any suitable cross-sectional shape. Thus, in accordance with another embodiment of the present invention, dielectric spacers are used in conjunction with metal interconnects having flared profiles, as depicted in FIG. 1. In one embodiment, dielectric spacers 108 contribute to the formation of hermetic seals around metal interconnects 102 and 104. By breaking the continuity of the dielectric spacers of adjacent metal interconnects, the capacitive coupling path between metal interconnects may be broken, diminishing the RC-delay. Thus, in accordance with an embodiment of the present invention, dielectric spacers 108 of metal interconnects 102 and 104 are discontiguous with (i.e. not connected to) one another, as is also depicted in FIG. 1.

A second level of interconnects having flared profiles sit above a second dielectric layer 106B, which in turn sits above metal interconnects 102 and 104. In accordance with an embodiment of the present invention, a third metal interconnect 110 is connected to metal interconnect 102 by a via 112 that is housed by dielectric layer 106B. Dielectric spacers 108 may have a width sufficient to provide a surface for via 112 to land in the case that via 112 is an un-landed via. In an embodiment, via 112 is landed on a portion of the top surface of metal interconnect 102 as well as on a portion of the top surface of dielectric spacer 108, as depicted in FIG. 1. In one embodiment, the width of dielectric spacers 108 is in the range of 5-30% of the width of a metal interconnect. In a specific embodiment, the width of dielectric spacers 108 is in the range of 5-20 nanometers. For comparison with un-landed via 112, a landed via 114 is depicted in FIG. 1, in accordance with another embodiment of the present invention.

The plurality of metal interconnects in interconnect structure 100 may further comprise a barrier layer 116. Barrier layer 116 may comprise any material suitable to inhibit electro-migration from the metal interconnects, to prevent oxidation of the metal interconnects, or to provide a surface for nucleation in a damascene process. In one embodiment, barrier layer 116 is comprised of a material selected from the group consisting of tantalum, titanium, tantalum nitride, titanium nitride or a combination thereof. In another embodiment, the thickness of barrier layer 116 is in the range of 50-150 Angstroms. The plurality of metal interconnects in interconnect structure 100 may also comprise a capping layer 118. Capping layer 118 may comprise any material suitable to inhibit electro-migration from the metal interconnects or to prevent oxidation of the metal interconnects. In one embodiment, capping layer 118 comprises a material selected from the group consisting of iridium, ruthenium, cobalt, cobalt/tungsten alloy, cobalt/tungsten phosphide, cobalt boron phosphide or a combination thereof.

Referring to FIG. 1, a gap 120 exists between the dielectric spacers 108 associated with neighboring metal interconnects 102 and 104. Gap 120 may be comprised of any suitable material or gas that isolates metal interconnects 102 and 104. In an embodiment, the material or gas of gap 120 contributes negligibly to the capacitive coupling between metal interconnects 102 and 104. In one embodiment, the material or gas of gap 120 is comprised of air. In another embodiment, the dielectric constant of the material or gas of gap 120 is between 1 and 2.5. In a specific embodiment, gap 120 is comprised of a carbon-doped oxide with 25-40% porosity. In an embodiment, the dielectric constant of the material or gas of gap 120 is less than the dielectric constant of dielectric layers 106A and 106B.

Gap 120 may be of a width sufficient to mitigate cross-talk between neighboring metal interconnects yet, in the case of an air-gap, may be sufficiently narrow at the top to block filling by dielectric layer 106B during the deposition of dielectric layer 106B. In an embodiment, gap 120 is sufficiently wide to mitigate cross-talk between neighboring dielectric spacers 108. In one embodiment, the top width of gap 120 is substantially equally to the width of dielectric spacer 108. In another embodiment, the top width of gap 120 is in the range of 5-20 nanometers. In a particular embodiment, the top width of gap 120 is approximately one third of the distance between neighboring metal interconnects.

Figure 2:
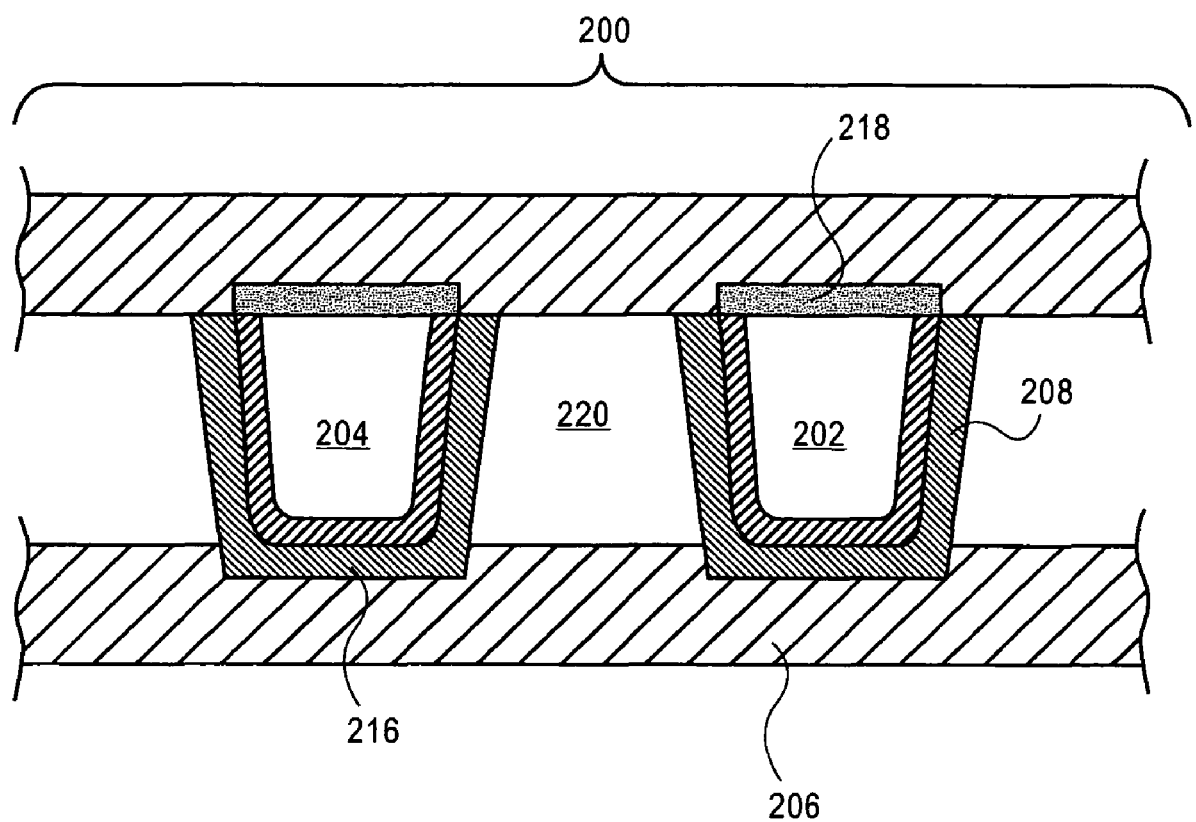
FIG. 2 illustrates a cross-sectional view of a pair of interconnects having flared profiles with discontiguous spacers, wherein the interconnects are recessed into the underlying dielectric layer, in accordance with an embodiment of the present invention.

A plurality of metal interconnects incorporating dielectric spacers may require structural reinforcement. In accordance with an embodiment of the present invention, such metal interconnects are recessed into the underlying dielectric layer, thus "anchoring" the metal interconnects. Referring to FIG. 2, metal interconnects 202 and 204, which may comprise a barrier layer 216 and a capping layer 218, are recessed into dielectric layer 206. Dielectric spacers 208 may be discontiguous and separated by gap 220, as depicted in FIG. 2. In accordance with an embodiment of the present invention, interconnect structure 200 from FIG. 2, comprising a plurality of metal interconnects, has an enhanced structural integrity resulting from the anchoring of metal interconnects 202 and 204. In one embodiment, recessed metal interconnects 202 and 204 are formed by a damascene process, where the recess into dielectric layer 206 is formed during the damascene patterning step, as described in more detail below.

Figure 3:
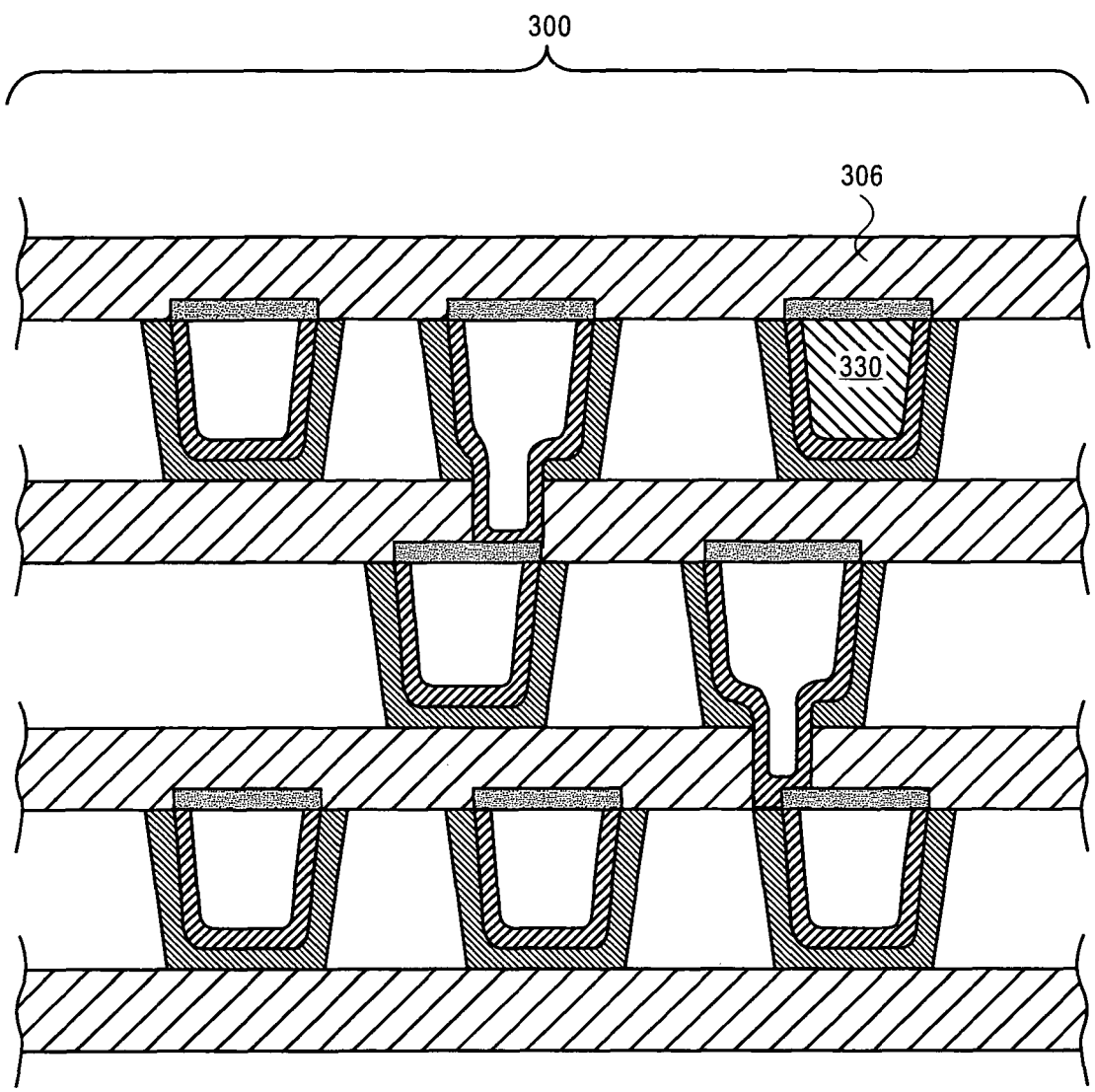
FIG. 3 illustrates a cross-sectional view of a plurality of interconnects having flared profiles with discontiguous spacers, in accordance with an embodiment of the present invention.

A plurality of metal interconnects incorporating dielectric spacers may comprise an architecture of active metal interconnects with a variable spacing. Such an architecture of various spacings between active metal interconnects may inhibit formation of a total air-gap architecture because the overlying dielectric layer may fill-in wider gaps and may thus increase the coupling capacitance between metal interconnects that are spaced further apart. In accordance with an embodiment of the present invention, a dummy metal interconnect, i.e. a metal interconnect that is not connected to the active portions of an integrated circuit, is used to maintain equal spacing between metal interconnects. Referring to FIG. 3, an interconnect structure 300 comprises a dummy metal interconnect 330 and a dielectric spacer. In one embodiment, dummy metal interconnect 330 blocks dielectric layer 306 from filling the gap between discontiguous dielectric spacers on neighboring active metal interconnects.

Figure 4:
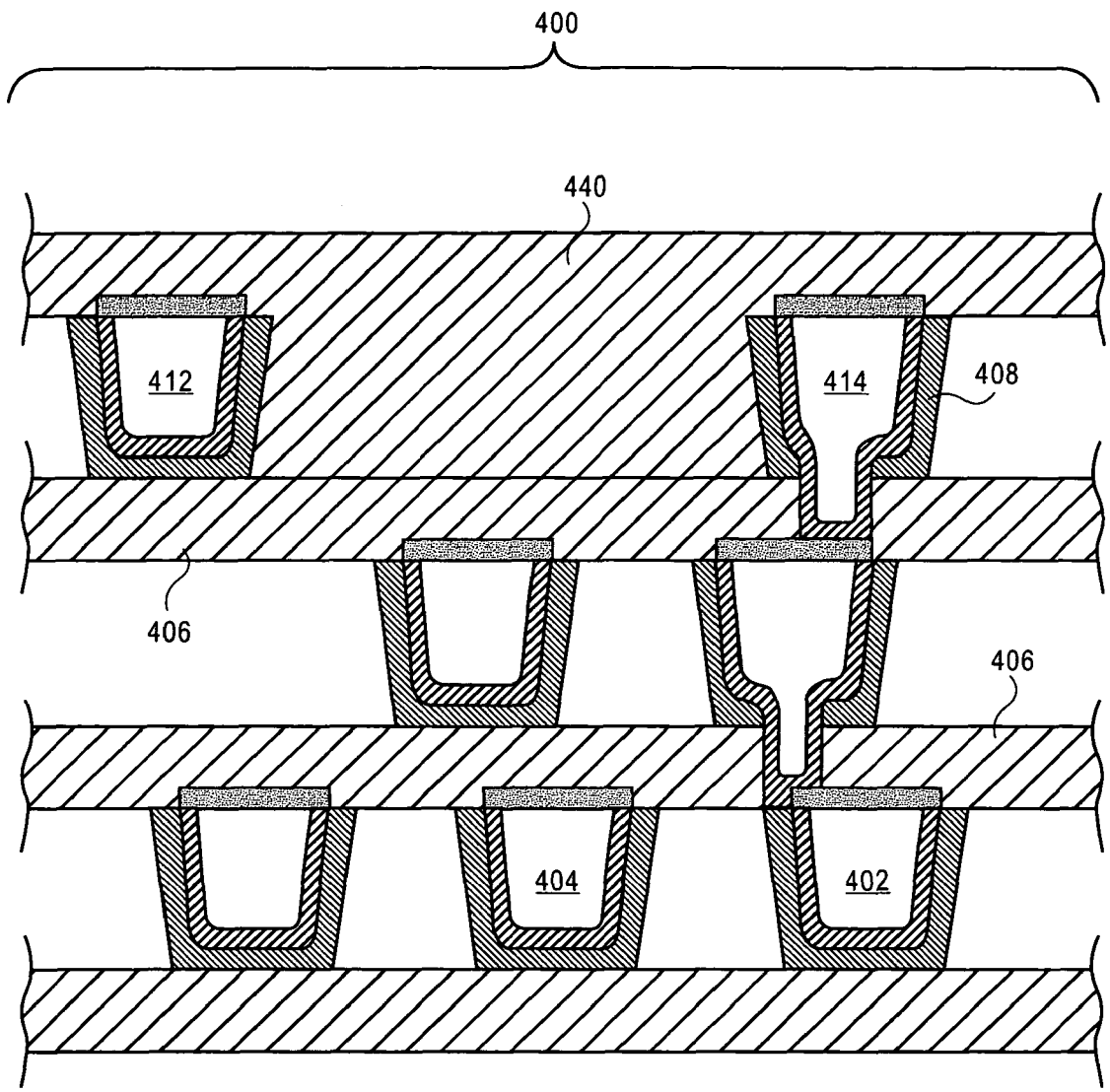
FIG. 4 illustrates a cross-sectional view of a plurality of interconnects having flared profiles with discontiguous spacers, in accordance with an embodiment of the present invention.

Alternative to the structure associated with FIG. 3, a plurality of metal interconnects incorporating dielectric spacers may comprise an architecture of active metal interconnects with a variable spacing, yet not incorporate dummy interconnects. In accordance with an embodiment of the present invention, the gap between dielectric spacers associated with neighboring metal interconnects that are spaced further apart from one another is in fact filled by an overlying dielectric layer. Referring to FIG. 4, neighboring metal interconnects 412 and 414 are spaced further apart than neighboring metal interconnects 402 and 404. Accordingly, dielectric layer 406, above metal interconnects 402 and 404, may not fill the gap between metal interconnects 402 and 404, while dielectric layer 440, above metal interconnects 412 and 414, may fill the gap between metal interconnects 412 and 414. In a specific embodiment, a gap with a top width substantially greater than the width of dielectric spacer 408 is filled by overlying dielectric layer 440, as depicted in FIG. 4. In one embodiment, the gap between metal interconnects 412 and 414 is greater than 45 nanometers. Dielectric layer 440 may be deposited by a technique suitable to fill a gap between metal interconnects 412 and 414, wherein the width of the gap is greater than the width of dielectric spacer 408, and to a thickness sufficient to be subsequently polished to a flat surface above, and in between, metal interconnects 412 and 414, as depicted in FIG. 4. Thus, in accordance with an embodiment of the present invention, dielectric layer 440 is deposited by a spin-on process to fill a gap between metal interconnects 412 and 414, wherein the width of the gap is greater than the width of dielectric spacer 408, to a thickness sufficient to provide a flat surface above and in between metal interconnects 412 and 414.

Dielectric spacers for metal interconnects may be fabricated by any suitable method that provides total coverage of the sidewalls of the metal interconnects with the dielectric spacer material. In accordance with an embodiment of the present invention, FIGS. 5A-J illustrate the formation of discontiguous dielectric spacers for a plurality of metal interconnects.

Figure 5A:
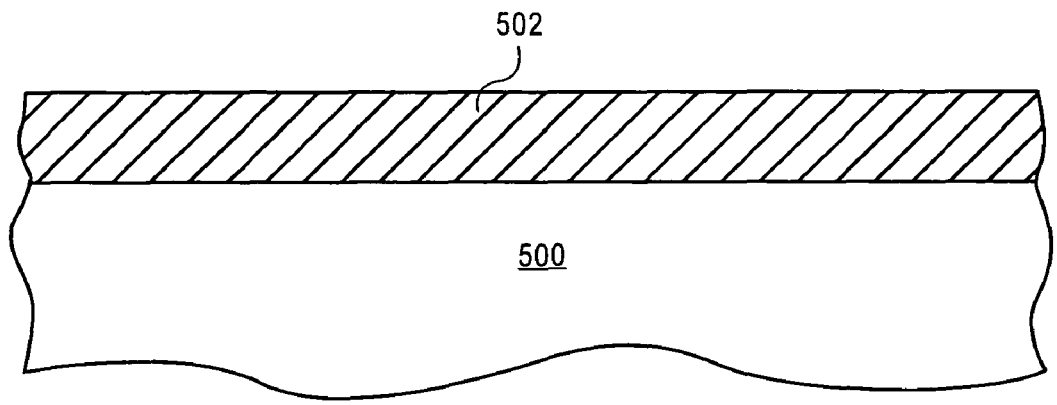
FIGS. 5A-J illustrate cross-sectional views representing the formation of a plurality of interconnects having flared profiles including the steps to form discontiguous dielectric spacers, in accordance with an embodiment of the present invention.

Referring to FIG. 5A, a dielectric layer 502 is formed above a structure 500. Structure 500 may be any structure onto which a plurality of metal interconnects is formed. In accordance with an embodiment of the present invention, structure 500 is an array of complimentary metal-oxide-semiconductor (CMOS) transistors fabricated in a silicon substrate and encased in a dielectric layer. A plurality of metal interconnects (e.g. the plurality of metal interconnects formed in the steps described below) may be formed above the transistors, and on the surrounding dielectric layer, and are used to electrically connect the transistors to form an integrated circuit.

Dielectric layer 502 may be deposited above structure 500 by any suitable technique that provides substantially even coverage of dielectric layer 502, as depicted in FIG. 5A. In one embodiment, dielectric layer 502 is deposited by a process selected from the group consisting of a spin-on process, a chemical vapor deposition process, or a polymer-based chemical vapor deposition process. In a specific embodiment, dielectric layer 502 is deposited by a chemical vapor deposition process involving silane or an organo-silane as a precursor gas. Dielectric layer 502 may be comprised of any material suitable to act as a durable base for a plurality of metal interconnects with dielectric spacers. In an embodiment, dielectric layer 502 is comprised of a material that does not significantly contribute to cross-talk between a series of metal interconnects subsequently formed on dielectric layer 502. In one embodiment, dielectric layer 502 is comprised of a low- to mid-K dielectric material and the dielectric constant of dielectric layer 502 is in the range of 2-5.5. In another embodiment, the dielectric constant of dielectric layer 502 is in the range of 2.5-4. In a particular embodiment, dielectric layer 502 is comprised of a material selected from the group consisting of silicon dioxide, a silicate, or a carbon-doped oxide with 0-10% porosity.

Figure 5B:
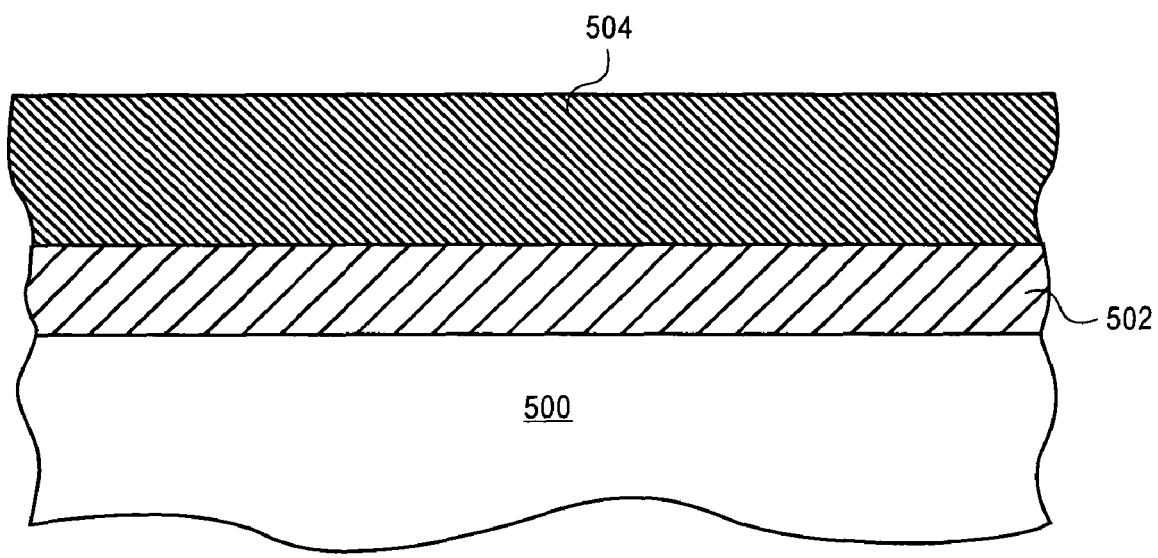

Metal interconnects may be formed above dielectric layer 502 by any technique suitable to provide patterned metal structures. In one embodiment, metal interconnects are formed by a subtractive etch process applied to a blanket metal film. In another embodiment, metal interconnects are formed by a damascene technique. Referring to FIGS. 5C-5F, a damascene technique using a sacrificial dielectric layer 504 is used to form a plurality of metal interconnects. Sacrificial dielectric layer 504 may be comprised of any material suitable for being patterned by a standard lithography/etch process and/or suitable for subsequent removal without impacting dielectric layer 502 or a subsequently formed metal interconnect. In one embodiment, sacrificial dielectric layer 504 is comprised of a carbon-doped silicon oxide with 20-35% porosity. Sacrificial dielectric layer 504 may be deposited by any suitable technique that provides substantially even coverage of sacrificial dielectric layer 504 above dielectric layer 502, as depicted in FIG. 5B. In one embodiment, sacrificial dielectric layer 504 is deposited by a process selected from the group consisting of a spin-on process, a chemical vapor deposition process, or a polymer-based chemical vapor deposition process.

Figure 5C:
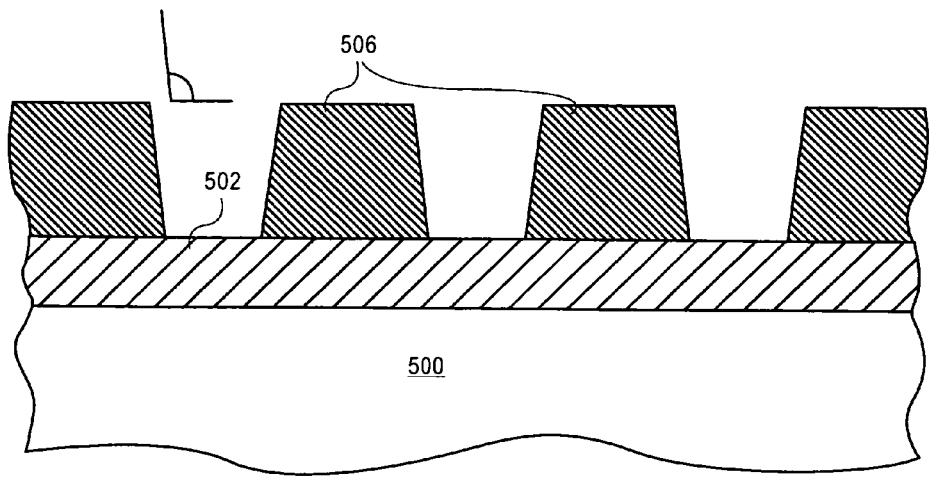

Referring to FIG. 5C, sacrificial dielectric layer 504 is patterned to form patterned sacrificial dielectric layer 506, which exposes portions of the top surface of dielectric layer 502. In one embodiment, sacrificial dielectric layer 504 is patterned by using an anisotropic etch process. In another embodiment, sacrificial dielectric layer 504 is patterned to form patterned sacrificial dielectric layer 506 by using a vertical dry or plasma etch process comprising fluorocarbons of the general formula $C_xF_y$, where x and y are natural numbers. In a specific embodiment, sacrificial dielectric layer 504 is patterned by using a vertical dry or plasma etch process comprising free radical fluorocarbons. In an alternative embodiment, sacrificial dielectric layer 504 is a photo-definable material and is patterned directly with a lithographic process.

Thus, a structure is formed comprising a patterned sacrificial dielectric layer 506 with a series of trenches formed therein. In one embodiment, the bottoms of the series of trenches formed in sacrificial dielectric layer 506 are flush with the top surface of dielectric layer 502. In an alternative embodiment, the bottoms of the series of trenches formed in sacrificial dielectric layer 506 are recessed into dielectric layer 502, in order to provide an anchoring point for the metal interconnects (as discussed above in association with FIG. 2). The cross-sectional shapes of the series of trenches may dictate the final shape of a series of metal interconnects formed therein. For example, in accordance with an embodiment of the present invention, the series of trenches have flared profiles, as depicted in FIG. 5C, and thus a series of metal interconnects formed subsequently therein have flared profiles. In one embodiment, the series of trenches have flared profiles with a flared angle θ in between 90 degrees and 155 degrees. In a specific embodiment, the flared angle is in the range of 105-135 degrees. The flared profiles of the series of trenches depicted in FIG. 5C may be a consequence of the patterning process utilized to form the series of trenches, such as the etch processes described above. For example, in accordance with an embodiment of the present invention, a flared profile is formed during the patterning of sacrificial dielectric layer 504 with an anisotropic plasma etch process. In one embodiment, the local bias of the plasma changes during the etching of sacrificial dielectric layer 504, resulting in a tapering of the profiles of the trenches that are produced to form patterned sacrificial dielectric layer 506. In another embodiment, the masking layer used to preserve portions of sacrificial dielectric layer 504 are slowly eroded during an etching process, resulting in a greater amount of material being removed from the top portion of the series of trenches as compared with the bottom portion of the series of said trenches.

Figure 5D:
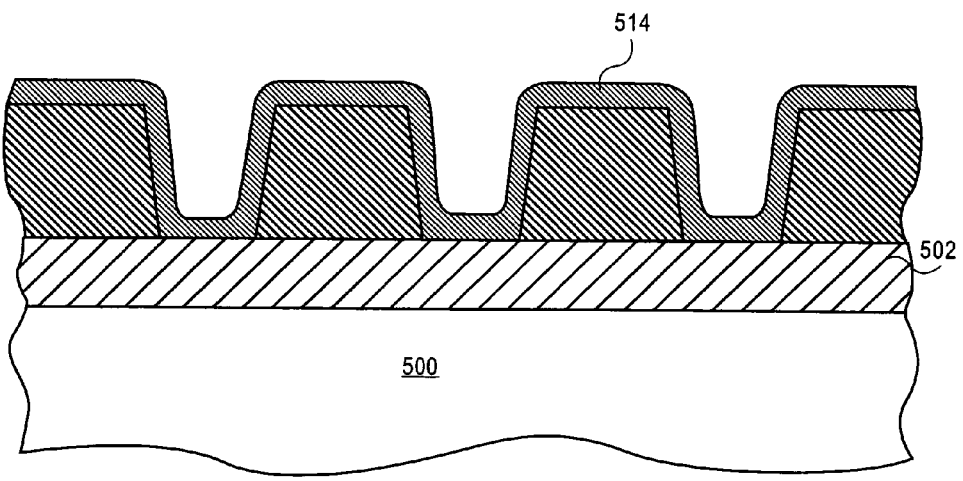

Referring to FIG. 5D, a spacer-forming dielectric layer 514 is deposited above patterned sacrificial dielectric layer 506. Thus, in accordance with an embodiment of the present invention, spacer-forming dielectric layer 514 is deposited prior to the formation of a plurality of metal interconnects. Spacer-forming dielectric layer 514 may be deposited by any suitable technique that renders a layer that is conformal, or nearly conformal, with patterned sacrificial dielectric layer 506. Also, spacer-forming dielectric layer 514 may be deposited by any suitable technique that does not over-heat any electronic or semiconductor devices that may reside in structure 500. In one embodiment, spacer-forming dielectric layer 514 is deposited at or below a temperature of 400° C. In another embodiment, spacer-forming dielectric layer 514 is deposited by a deposition process selected from the group consisting of atomic layer deposition or chemical vapor deposition. Spacer-forming dielectric layer 514 may be formed from any material suitable to mitigate cross-talk between a subsequently formed plurality of metal interconnects, while adding structural support to the plurality of metal interconnects. In one embodiment, spacer-forming dielectric layer 514 is comprised of a material selected from the group consisting of silicon nitride, silicon carbide, nitrogen-doped silicon carbide, oxygen-doped silicon carbide, boron-doped carbon nitride or boron-doped silicon carbide. In another embodiment, spacer-forming dielectric layer 514 is comprised of a boron-doped carbon nitride layer, wherein said boron-doped carbon nitride layer is formed by reacting the gases methane, diborane, and ammonia. In an alternative embodiment, spacer-forming dielectric layer 514 comprises a metal-based material selected from the group consisting of CoW or CoWBP.

Figure 5E:
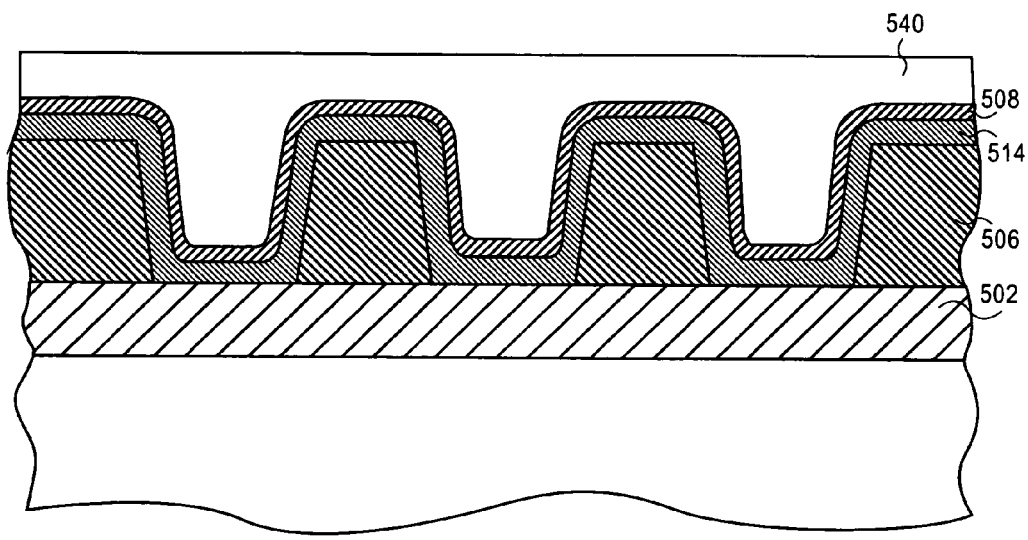

Referring to FIG. 5E, a barrier layer 508 is formed above spacer-forming dielectric layer 514. Barrier layer 508 may be comprised of any material and of a sufficient thickness suitable to inhibit out-diffusion of the metal atoms from within a metal interconnects. In one embodiment, barrier layer 508 is comprised of a material selected from the group consisting of tantalum, titanium, tantalum nitride, titanium nitride or a combination thereof. In an embodiment, the thickness of barrier layer 508 is in the range of 25-250 Angstroms. Barrier layer 508 may be deposited by any suitable technique that provides a conformal, or nearly conformal, layer above spacer-forming dielectric layer 514. In one embodiment, barrier layer 508 is deposited by a process selected from the group consisting of an atomic layer deposition process, a chemical vapor deposition process or a physical vapor deposition process.

Referring again to FIG. 5E, an interconnect-forming metal layer 540 is formed above barrier layer 508. Interconnect-forming metal layer 540 may be formed by any process and from any conductive material suitable for completely (or mostly, if a void is inadvertently formed) filling the series of trenches formed in patterned sacrificial dielectric layer 506. In an embodiment, interconnect-forming metal layer 540 is comprised of a material selected from the group consisting of copper, silver, aluminum or an alloy thereof. In one embodiment, interconnect-forming metal layer 540 is comprised of polycrystalline copper with an atomic composition in the range of 97-100% copper atoms. In an embodiment, interconnect-forming metal layer 540 is deposited by a technique selected from the group comprising an electro-chemical deposition process, an electro-less deposition process, a chemical vapor deposition process, an atomic layer deposition (ALD) process or a reflow process.

Figure 5F:
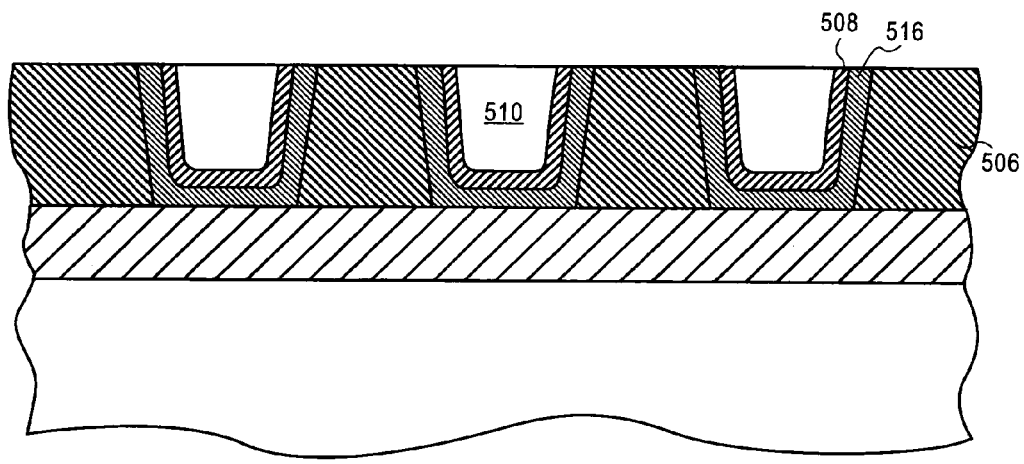

Referring to FIG. 5F, all portions of spacer-forming dielectric layer 514, barrier layer 508 and interconnect-forming metal layer 540 that are above the top surface of patterned sacrificial dielectric layer 506 are removed. Thus, a series of metal interconnects, including metal interconnect 510, with barrier layers 508 and dielectric spacers 516 is formed. The dielectric spacers 516 of adjacent metal interconnects may be discontiguous from one another, as depicted in FIG. 5F. The portions of spacer-forming dielectric layer 514, barrier layer 508 and interconnect-forming metal layer 540 that are above the top surface of patterned sacrificial dielectric layer 506 may be removed by any technique suitable to remove these portions without significantly eroding the portions that are encased in patterned sacrificial dielectric layer 506. In accordance with an embodiment of the present invention, the portions of spacer-forming dielectric layer 514, barrier layer 508 and interconnect-forming metal layer 540 that are above the top surface of patterned sacrificial dielectric layer 506 are removed with a process selected from the group consisting of a plasma etch process, a chemical etch process, a chemical-mechanical polish process or an electro-polish process. In a specific embodiment, the portions of spacer-forming dielectric layer 514, barrier layer 508 and interconnect-forming metal layer 540 that are above the top surface of patterned sacrificial dielectric layer 506 are removed with a chemical-mechanical polish process that uses a slurry comprised of alumina and potassium hydroxide.

Figure 5G:
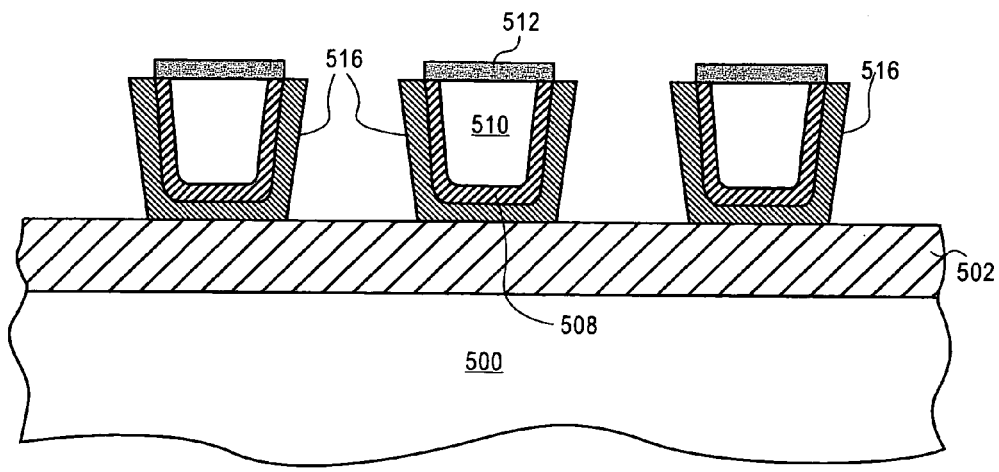

Referring to FIG. 5G, a capping layer 512 is formed on the top surface of a plurality of metal interconnects, including metal interconnect 510. Capping layer 512 may be comprised of any material suitable to prevent metal line extrusion or metal atom out-diffusion from metal interconnect 510. Additionally, capping layer 512 may provide benefits for inhibiting electro-migration from metal interconnect 510 and/or for preventing oxidation of the top surfaces of metal interconnect 510. In one embodiment, capping layer 512 is comprised of a conductive layer selected from the group consisting of iridium, ruthenium, cobalt, a cobalt/tungsten alloy, cobalt/tungsten phosphide, cobalt tungsten boron phosphide, cobalt boron phosphide or a combination thereof. Capping layer 512 may be formed by any process suitable for uniformly covering the top surfaces of metal interconnect 510. In one embodiment, capping layer 512 is deposited by a technique selected from the group comprising an electro-chemical deposition process, an electro-less deposition process or an atomic layer deposition (ALD) process.

Patterned sacrificial dielectric layer 506 may be removed to provide free-standing metal interconnect 510, as depicted in FIG. 5G. Patterned sacrificial dielectric layer 506 may be removed by any suitable technique wherein the removal process does not impact dielectric layer 502 or metal interconnect 510. In accordance with one embodiment of the present invention, patterned sacrificial dielectric layer 506 is comprised of a carbon-doped oxide with 20-35% porosity, dielectric layer 502 is comprised of a carbon-doped oxide with 0-10% porosity, and patterned sacrificial dielectric layer 506 is removed with a wet etch chemistry that comprises 20-30% by volume of tetramethylammonium hydroxide. In an embodiment, patterned sacrificial dielectric layer 506 is removed prior to the formation of capping layer 512. In another embodiment, capping layer 512 is formed prior to the removal of patterned sacrificial dielectric layer 506. In an alternative embodiment, patterned sacrificial dielectric layer 506 is not removed and is retained in the final interconnect structure.

Figure 5H:
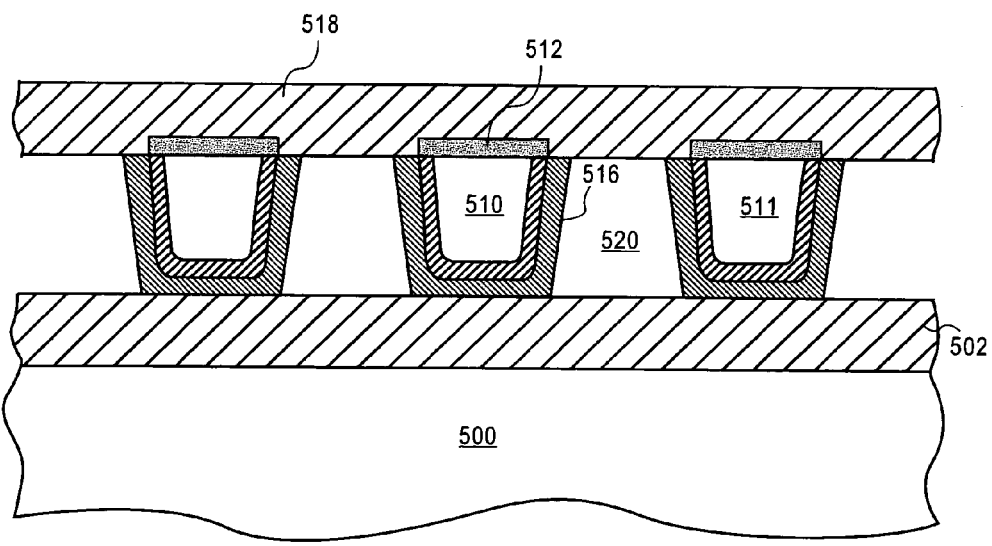

Referring to FIG. 5H, a dielectric layer 518 is deposited above a plurality of metal interconnects, including metal interconnect 510, and above dielectric spacers 516. Dielectric layer 518 may be deposited by any suitable technique that provides substantially even coverage above the plurality of metal interconnects, including metal interconnects 510 and 511, and above dielectric spacers 516 without substantially filling the space between dielectric spacers 516 from neighboring metal interconnects 510 and 511, as depicted in FIG. 5H. In one embodiment, dielectric layer 518 is deposited by a process selected from the group consisting of a spin-on process, a chemical vapor deposition process, or a polymer-based chemical vapor deposition process. Dielectric layer 518 may comprise any material suitable to act as a durable base for a new level of metal interconnects. In one embodiment, dielectric layer 518 is comprised of a material selected from the group consisting of silicon dioxide, a silicate, or a carbon-doped oxide with 0-10% porosity. In an alternative embodiment, patterned sacrificial dielectric layer 506 is removed subsequent to the formation of dielectric layer 518 by a method selected from the group comprising pyrolysis, thermal decomposition, or irradiation.

Referring again to FIG. 5H, a gap 520 is formed between dielectric spacers 516 of neighboring metal interconnects 510 and 511 and in between dielectric layers 502 and 518. Gap 520 may be comprised of any suitable material or gas that enables a negligible capacitive coupling between metal interconnects 510 and 511. In one embodiment, gap 520 is comprised of air. In another embodiment, gap 520 is comprised of a carbon-doped oxide with 25-40% porosity, the formation of which is discussed in association with FIGS. 6A-C below.

Figure 5I:
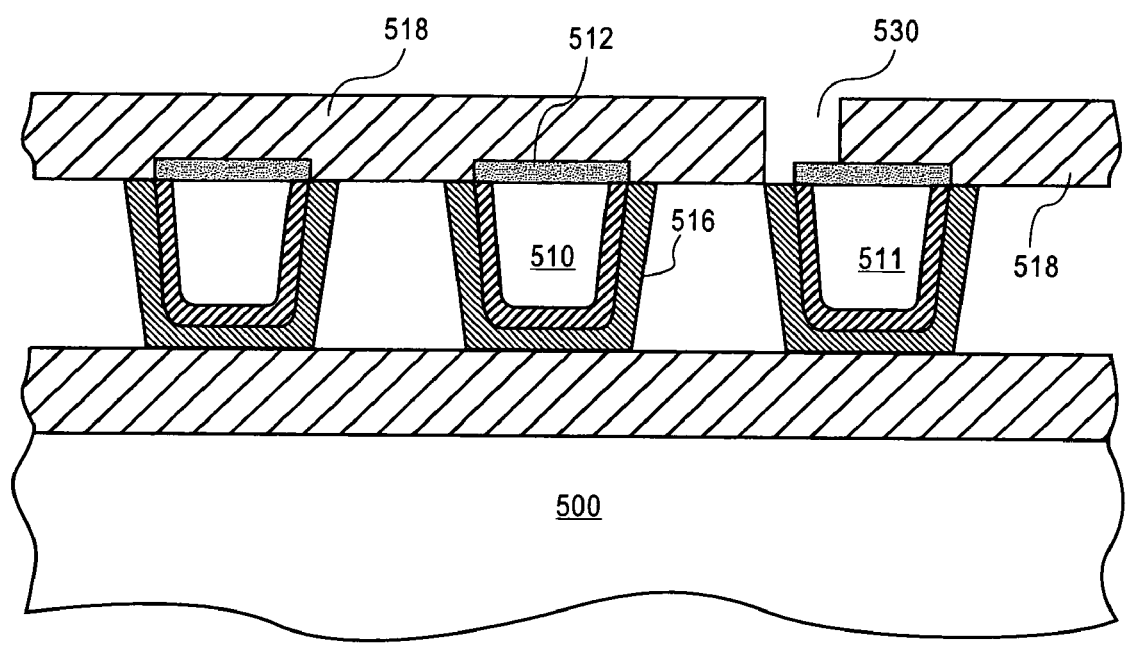

Referring to FIG. 5I, dielectric layer 518 may be patterned to form a via trench 530 above a portion of metal interconnect 511, or its respective capping layer 512. A portion of via trench 530 may not be directly above the top surface of metal interconnect 511, but rather above a portion of dielectric spacer 516, and is thus un-landed. Thus, in accordance with an embodiment of the present invention, dielectric spacer 516 provides a surface onto which such an un-landed via trench 530 can land, as depicted in FIG. 5I.

Figure 5J:
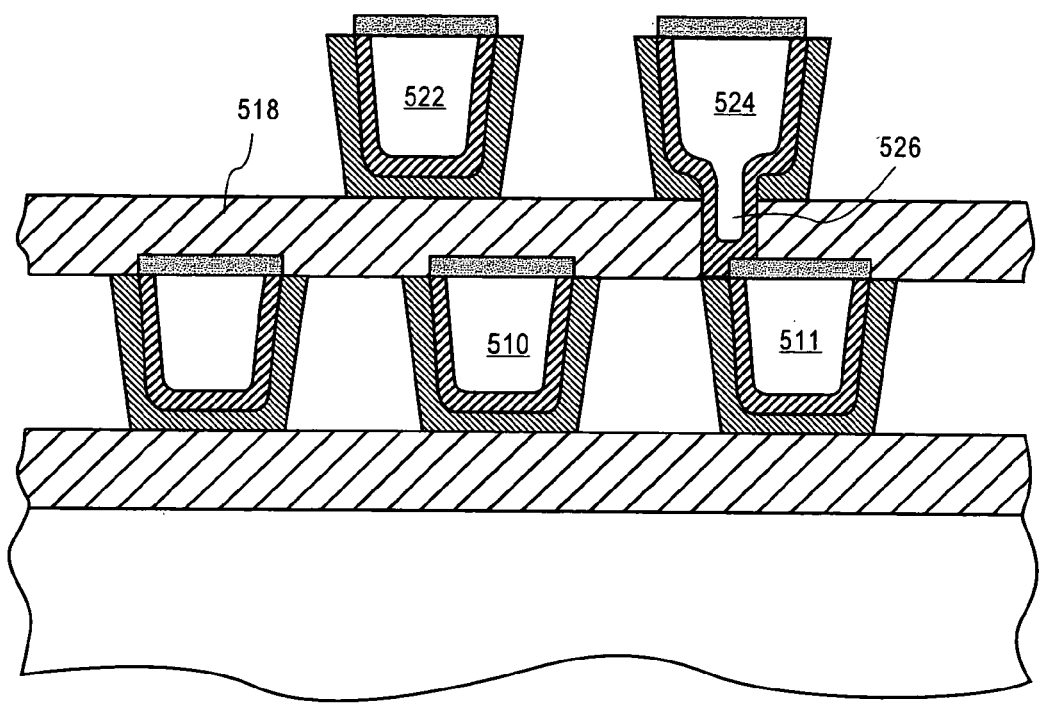

Referring to FIG. 5J, a second level of metal interconnects, including metal interconnects 522 and 524, is formed above dielectric layer 518. In accordance with an embodiment of the present invention, metal interconnect 524 is connected with underlying metal interconnect 511 by un-landed via 526. Thus, an air-gap metal interconnect architecture with discontiguous dielectric spacers, which provide a region upon which un-landed vias may land, can be formed.

Figure 6A:
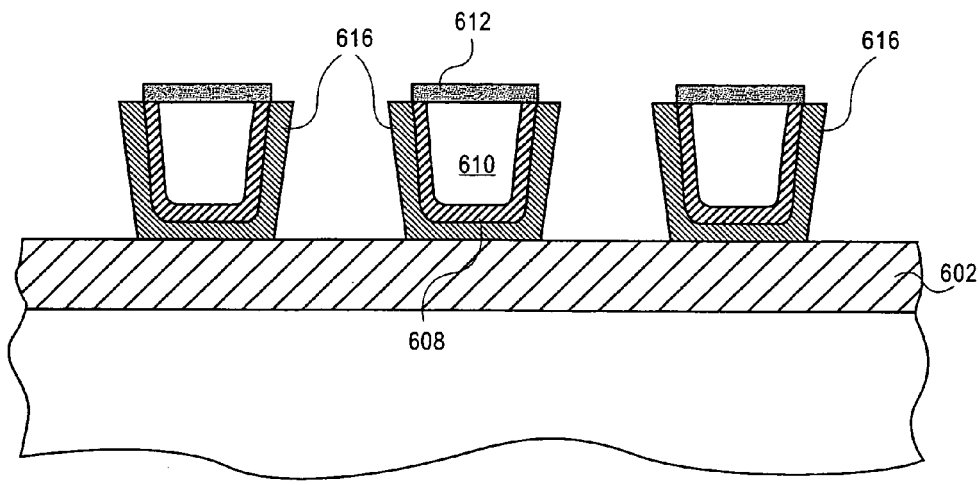
FIGS. 6A-C illustrate cross-sectional views representing the formation of a plurality of interconnects having flared profiles with discontiguous spacers, in accordance with an embodiment of the present invention.
Figure 6B:
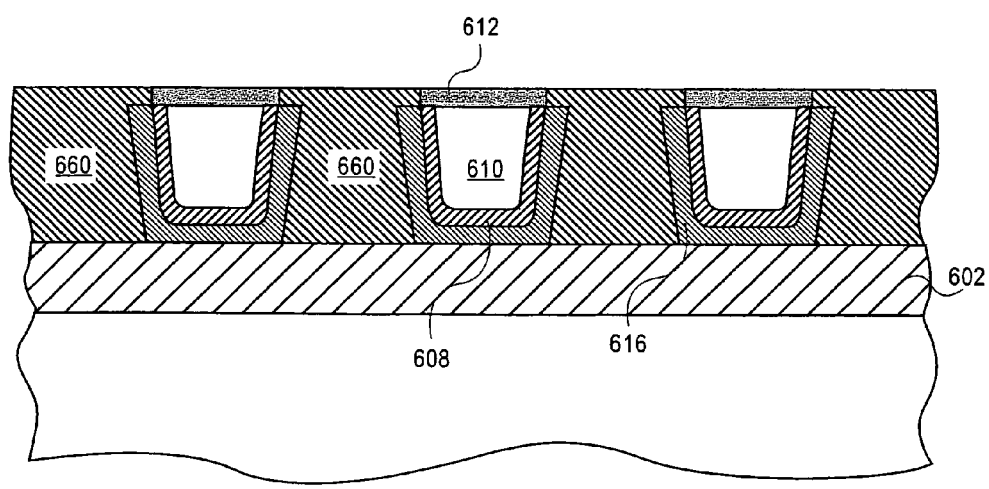
Figure 6C:
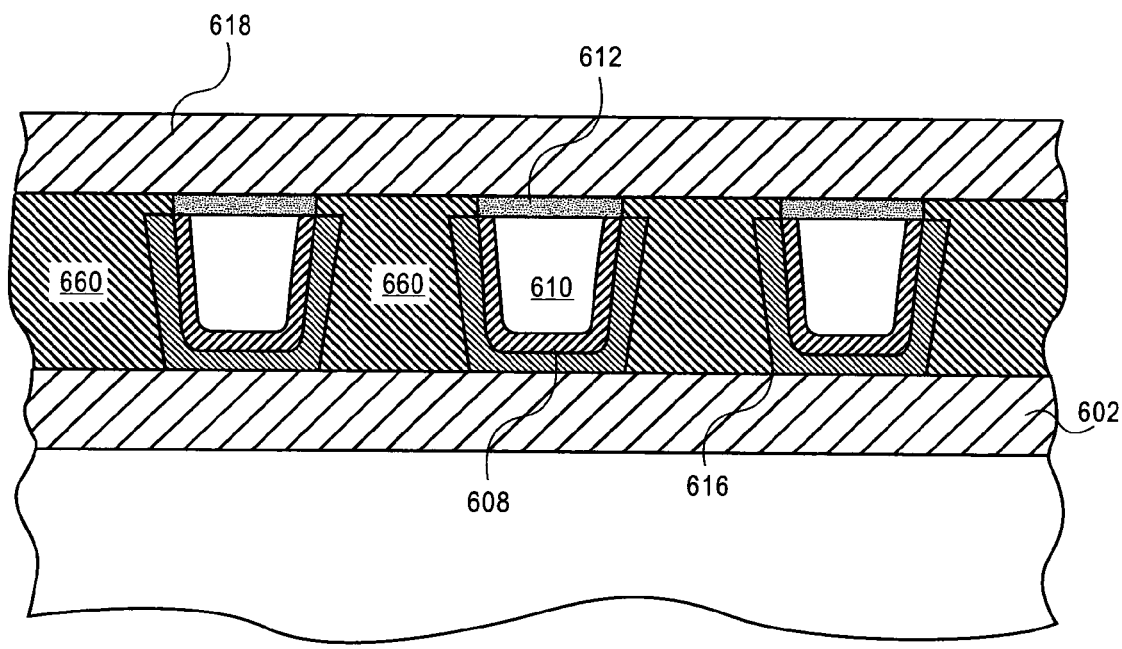

In accordance with another embodiment of the present invention, gap 520 from FIG. 5H may be filled with a material other than air, as illustrated in FIGS. 6A-C. Referring to FIG. 6B, an interstitial dielectric layer 660 is deposited on the structure shown in FIG. 6A (which is analogous to the structure in FIG. 5G). Interstitial dielectric layer 660 may be comprised of any material suitable to enable a negligible capacitive coupling between a plurality of metal interconnects, including metal interconnect 610. In one embodiment, the dielectric constant of interstitial dielectric layer 660 is between 1 and 2.5. In another embodiment, interstitial dielectric layer 660 is comprised of a carbon-doped oxide with 25-40% porosity. In one embodiment, the dielectric constant of interstitial dielectric layer 660 is less than the dielectric constant of dielectric layer 602.

Referring to FIG. 6C, dielectric layer 618 is then be deposited above a plurality of metal interconnects, including metal interconnect 610, having an interstitial dielectric layer 660. Dielectric layer 618 may be comprised of any material discussed in association with dielectric layer 518 from FIG. 5I. In one embodiment, the dielectric constant of interstitial dielectric layer 660 is less than the dielectric constant of dielectric layer 618. Thus, an "ultra low-K gap" metal interconnect architecture with discontiguous dielectric spacers may be formed.

Although the foregoing embodiments contemplate dielectric spacers for metal interconnects, the present invention is not limited to the use of metal interconnects. Conductive carbon nanotubes may be bundled together and used as interconnects to incorporate electronic or semiconducting devices into an integrated circuit. In accordance with another embodiment of the present invention, dielectric spacers are used in conjunction with interconnects based on bundles of conductive carbon nanotubes. In a specific embodiment, the bundles of carbon nanotubes have flared profiles as a result of fabrication via a damascene process. Thus, dielectric spacers may be formed on the sidewalls of interconnects formed from bundles of carbon nanotubes in order to reduce the RC-delay associated with such interconnects, to provide durability to the interconnect architecture, or to provide a surface onto which un-landed vias may land onto the interconnects.

Thus, a plurality of metal interconnects incorporating dielectric spacers and a method to form such dielectric spacers have been described. In one embodiment, the dielectric spacers are adjacent to neighboring metal interconnects having flared profiles and are discontiguous from one another. In another embodiment, the dielectric spacers provide a region upon which un-landed vias can effectively land.

What is claimed is:

1. An electronic structure with a plurality of interconnects, comprising:
   a first dielectric layer;
   a first interconnect above a first portion of said first dielectric layer, wherein said first interconnect comprises a first dielectric spacer directly adjacent to a pair of sidewalls of said first interconnect and directly between said first dielectric layer and the bottom surface of said first interconnect;

a second interconnect above a second portion of said first dielectric layer, said second portion of said first dielectric layer continuous with said first portion of said first dielectric layer, wherein said second interconnect comprises a second dielectric spacer directly adjacent to a pair of sidewalls of said second interconnect and directly between said first dielectric layer and the bottom surface of said second interconnect, and wherein said second dielectric spacer is discontiguous from said first dielectric spacer;

a second dielectric layer, wherein said second dielectric layer is above said first and said second interconnects; and a gap in between said first dielectric layer, said first interconnect, said second interconnect and said second dielectric layer.

2. The structure of claim 1 wherein said first and said second interconnects have flared profiles with a flared angle in between 90 degrees and 155 degrees.

3. The structure of claim 2 wherein said flared angle is in the range of 105-135 degrees.

4. The structure of claim 2 wherein said second dielectric layer and said first and said second dielectric spacers form hermetic seals around said first and said second interconnects, respectively.

5. The structure of claim 4 wherein said gap is comprised of air.

6. The structure of claim 2 wherein the dielectric constant of said first and said second dielectric spacers is greater than the dielectric constant of said first and said second dielectric layers, and wherein the dielectric constant of said first and said second dielectric layers is greater than the dielectric constant of said gap.

7. The structure of claim 6 wherein said first and said second dielectric spacers are comprised of a material selected from the group consisting of silicon nitride, silicon carbide, nitrogen-doped silicon carbide, oxygen-doped silicon carbide, boron-doped carbon nitride or boron-doped silicon carbide, wherein said first and said second dielectric layers are comprised of a material selected from the group consisting of silicon dioxide, a silicate, or a carbon-doped oxide with 0-10% porosity, and wherein said gap is comprised of a carbon-doped oxide with 25-40% porosity.

8. The structure of claim 2 wherein the width of said first and said second dielectric spacers is substantially equal to the top width of said gap.

9. The structure of claim 8 wherein the width of said first and said second dielectric spacers is in the range of 5-20 nanometers.

10. The structure of claim 2 further comprising:
a via in said second dielectric layer, wherein a first portion of said via is on the top surface of said first interconnect, and wherein a second portion of said via is on the top surface of said first dielectric spacer.

11. The structure of claim 2 wherein said first and said second interconnects are recessed into said first dielectric layer.

12. An electronic structure with a plurality of interconnects, comprising:
a first dielectric layer;
a first interconnect above said first dielectric layer, wherein said first interconnect comprises a first dielectric spacer directly adjacent to a pair of sidewalls of said first interconnect and directly between said first dielectric layer and the bottom surface of said first interconnect;
a second interconnect above said first dielectric layer, wherein said second interconnect comprises a second dielectric spacer directly adjacent to a pair of sidewalls of said second interconnect and directly between said first dielectric layer and the bottom surface of said second interconnect, and wherein said second dielectric spacer is discontiguous from said first dielectric spacer;

a second dielectric layer, wherein said second dielectric layer is above said first and said second interconnects;

a third interconnect above said second dielectric layer, wherein said third interconnect comprises a third dielectric spacer directly adjacent to a pair of sidewalls of said third interconnect and directly between said second dielectric layer and the bottom surface of said third interconnect;

a fourth interconnect above said second dielectric layer, wherein said fourth interconnect comprises a fourth dielectric spacer directly adjacent to a pair of sidewalls of said fourth interconnect and directly between said second dielectric layer and the bottom surface of said fourth interconnect, and wherein said fourth dielectric spacer is discontiguous from said third dielectric spacer;

a third dielectric layer, wherein said third dielectric layer is above said third and said fourth interconnects;

a first gap in between said first dielectric layer, said first interconnect, said second interconnect and said second dielectric layer, wherein said second dielectric layer does not fill said first gap; and a second gap in between said second dielectric layer, said second third interconnect, said fourth interconnect and said third dielectric layer, wherein said second gap has a top width substantially larger than the top width of said first gap, and wherein said third dielectric layer fills said second gap.

13. The structure of claim 12 wherein said first, said second, said third and said fourth interconnects have flared profiles with a flared angle in between 90 degrees and 155 degrees.

14. The structure of claim 13 wherein said flared angle is in the range of 105-135 degrees.

15. The structure of claim 13 wherein said second dielectric layer and said first, and said second dielectric spacers form hermetic seals around said first and said second interconnects, respectively.

16. The structure of claim 15 wherein said first gap is comprised of air.

17. The structure of claim 13 wherein the dielectric constant of said first, said second, said third, and said fourth dielectric spacers is greater than the dielectric constant of said first, said second, and said third dielectric layers, and wherein the dielectric constant of said first, said second, and said third dielectric layers is greater than the dielectric constant of said first gap.

18. The structure of claim 17 wherein said first, said second, said third, and said fourth dielectric spacers are comprised of a material selected from the group consisting of silicon nitride, silicon carbide, nitrogen-doped silicon carbide, oxygen-doped silicon carbide, boron-doped carbon nitride or boron-doped silicon carbide, wherein said first, said second, and said third dielectric layers are comprised of a material selected from the group consisting of silicon dioxide, a silicate, or a carbon-doped oxide with 0-10% porosity, and wherein said first gap is comprised of a carbon-doped oxide with 25-40% porosity.

19. The structure of claim 13 wherein the width of said first, said second, said third, and said fourth dielectric spacers is substantially equal to the top width of said first gap.

20. The structure of claim 19 wherein the width of said first, said second, said third, and said fourth dielectric spacers is in the range of 5-20 nanometers.

21. The structure of claim 20 wherein the top width of said second gap is greater than 45 nanometers.

22. The structure of claim 13 further comprising:
a via in said second dielectric layer, wherein a first portion of said via is on the top surface of said first interconnect, and wherein a second portion of said via is on the top surface of said first dielectric spacer.

23. The structure of claim 13 wherein said first and said second interconnects are recessed into said first dielectric layer.

* * * * *

UNITED STATES PATENT AND TRADEMARK OFFICE
CERTIFICATE OF CORRECTION

PATENT NO. : 7,772,702 B2 Page 1 of 1
APPLICATION NO. : 11/525709
DATED : August 10, 2010
INVENTOR(S) : Bielefeld et al.

It is certified that error appears in the above-identified patent and that said Letters Patent is hereby corrected as shown below:

In column 12, at line 29 after, -- said -- delete "second".

Signed and Sealed this

Twenty-third Day of November, 2010

David J. Kappos
*Director of the United States Patent and Trademark Office*